United States Patent [19]
Lim et al.

[11] Patent Number: 6,081,460
[45] Date of Patent: Jun. 27, 2000

[54] INTEGRATED CIRCUIT DEVICES HAVING VOLTAGE LEVEL RESPONSIVE MODE-SELECTION CIRCUITS THEREIN AND METHODS OF OPERATING SAME

[75] Inventors: Jong-hyoung Lim; Sang-suk Kang, both of Kyungki-do, Rep. of Korea

[73] Assignee: Samsung Electronics Co., Ltd., Rep. of Korea

[21] Appl. No.: 09/223,133

[22] Filed: Dec. 30, 1998

[30] Foreign Application Priority Data

Dec. 30, 1997 [KR] Rep. of Korea ............. 97-77787

[51] Int. Cl.⁷ .................................................... G11C 7/00
[52] U.S. Cl. .................. 365/189.11; 365/201; 365/233.5
[58] Field of Search ............... 365/189.11, 201, 365/233.5, 189.01, 230.06

[56] References Cited

U.S. PATENT DOCUMENTS 5,646,902 7/1997 Park ........................................ 365/233.5
5,708,604 1/1998 Fontana et al. ...................... 365/233.5

*Primary Examiner*—Vu A. Le
*Attorney, Agent, or Firm*—Myers Bigel Sibley & Sajovec

[57] ABSTRACT

Integrated circuit devices include preferred mode selection circuits therein which generate a signal that designates a first mode of the integrated circuit device when a potential of a first control signal is within a first range and a potential of a power supply signal (e.g., Vcc) is within a second range at the same time. The mode selection circuit also prevents changes in the potential of the first control signal from disabling the first mode when the potential of the power supply signal is not within the second range. When the integrated circuit device is a memory device, the first control signal may be a row or column address signal (Ai), for example. The mode selection circuit may comprise a level shifter which generates a downward level shifted version of the address signal. The mode selection circuit generates a signal that designates a first mode of the memory device when a potential of the address signal exceeds a first threshold (e.g., 5 volts) and a potential of the power supply signal (Vcc) is below a second threshold at the same time. The mode selection circuit also prevents changes in the potential of the address signal (Ai) from disabling the first mode so long as a potential of the power supply signal (Vcc) exceeds the second threshold.

20 Claims, 4 Drawing Sheets

INTEGRATED CIRCUIT DEVICES HAVING VOLTAGE LEVEL RESPONSIVE MODE-SELECTION CIRCUITS THEREIN AND METHODS OF OPERATING SAME

RELATED APPLICATION

This application is related to Korean Application No. 97-77787, filed Dec. 30, 1997, the disclosure of which is hereby incorporated herein by reference.

FIELD OF THE INVENTION

The present invention relates to integrated circuit devices, and more particularly to integrated circuit memory devices and methods of operating integrated circuit memory devices.

BACKGROUND OF THE INVENTION

Many state-of-the-art integrated circuit devices have the capability of operating in one of a variety of different operating modes and include mode selection circuits therein which designate these modes. For example, FIG. 1 illustrates a conventional mode register set circuit for use in memory devices (e.g., DRAM devices). This mode register set circuit 10 includes an address input buffer 101, a mode register 103, a mode register set signal generator 105 and a mode register set signal delay unit 107. The address input buffer 101 receives an external address signal Ai, converts the voltage level of the address signal Ai to a voltage level suitable for the memory device and passes the address signal to the mode register 103. The mode register set signal generator 105 receives external control signals S1, S2 and S3 and generates a mode register set signal MRSET. As will be understood by those skilled in the art, these external control signals may be strobe signals that can be used to control the operating mode of the memory device. The mode register set signal delay unit 107 provides a predetermined amount of delay to the mode register set signal MRSET and generates a delayed version of the mode register set signal MRSET as MRSET_D. The mode register 103 receives the address signal Ai and generates a mode selection signal PMODEi in response to the mode register set signal MRSET and the delayed mode register set signal MRSET_D. The mode register 103 includes transmission gates 111 and 112, latches 121 and 122, and an inverter 131. Based on this configuration of the mode register, the mode selection signal PMODEi is only generated after the mode register set signal MRSET and the delayed mode register set signal MRSET_D are driven to logic 1 levels.

Unfortunately, the conventional mode register set circuit of FIG. 1 generally uses of a plurality of dedicated control signals S1, S2 and S3 which are generated externally. Frequently, however, these plurality of control signals S1, S2 and S3 do not significantly influence operation of the memory device during normal operating modes and the user has the burden of setting the control signals S1, S2 and S3 to generate the mode selection signal PMODEi when using the mode register set circuit. Thus, notwithstanding such integrated circuit devices, there continues to be a need for integrated circuit devices having improved mode selection circuits therein.

SUMMARY OF THE INVENTION

It is therefore an object of the present invention to provide improved integrated circuit devices and methods of operating same.

It is another object of the present invention to provide integrated circuit memory devices having improved mode selection circuits therein and methods of operating same.

These and other objects, advantages and features of the present invention are provided by integrated circuit devices which utilize level shifters to recognize when an existing signal line (or input signal pad) is being used as a mode selection signal line. In particular, a desired mode of an integrated circuit may be set by using a level shifter to detect the presence of a increased voltage on an existing signal line. For example, an address signal line of an integrated circuit memory device may typically be provided with logic 0 and logic 1 address signals in a range from 0–3 volts during normal operation and a logic 1 mode selection signal of greater than 5 volts when selecting a desired mode of the integrated circuit. Thus, according to the present invention, an existing signal line of an integrated circuit device can be utilized to provide a greater amount of data to an on-chip circuit by using level detectors to detect signals that exceed preselected threshold voltage levels.

More specifically, an embodiment of the present invention includes a preferred mode selection circuit which generates a signal that designates a first mode of the integrated circuit device when a potential of a first control signal is within a first range and a potential of a power supply signal (e.g., Vcc) is simultaneously within a second range. The mode selection circuit also prevents changes in the potential of the first control signal from disabling the first mode when the potential of the power supply signal is not within the second range. When the integrated circuit device is a memory device, the first control signal may be a row or column address signal (Ai), for example. According to this aspect of the present invention, the mode selection circuit may comprise a level shifter which generates a downward level shifted version of the address signal. According to another aspect of the present invention, the mode selection circuit is responsive to an address signal (Ai) and a power supply signal (Vcc) and generates a signal that designates a first mode of the memory device when a potential of the address signal exceeds a first threshold (e.g., 5 volts) and a potential of the power supply signal (Vcc) is simultaneously below a second threshold. Here, the mode selection circuit also prevents changes in the potential of the address signal (Ai) from disabling the first mode so long as a potential of the power supply signal (Vcc) exceeds the second threshold.

DESCRIPTION OF PREFERRED EMBODIMENTS

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. Like numbers refer to like elements throughout and signal lines and signals thereon may be referred to by the same reference symbols.

Figure 1:
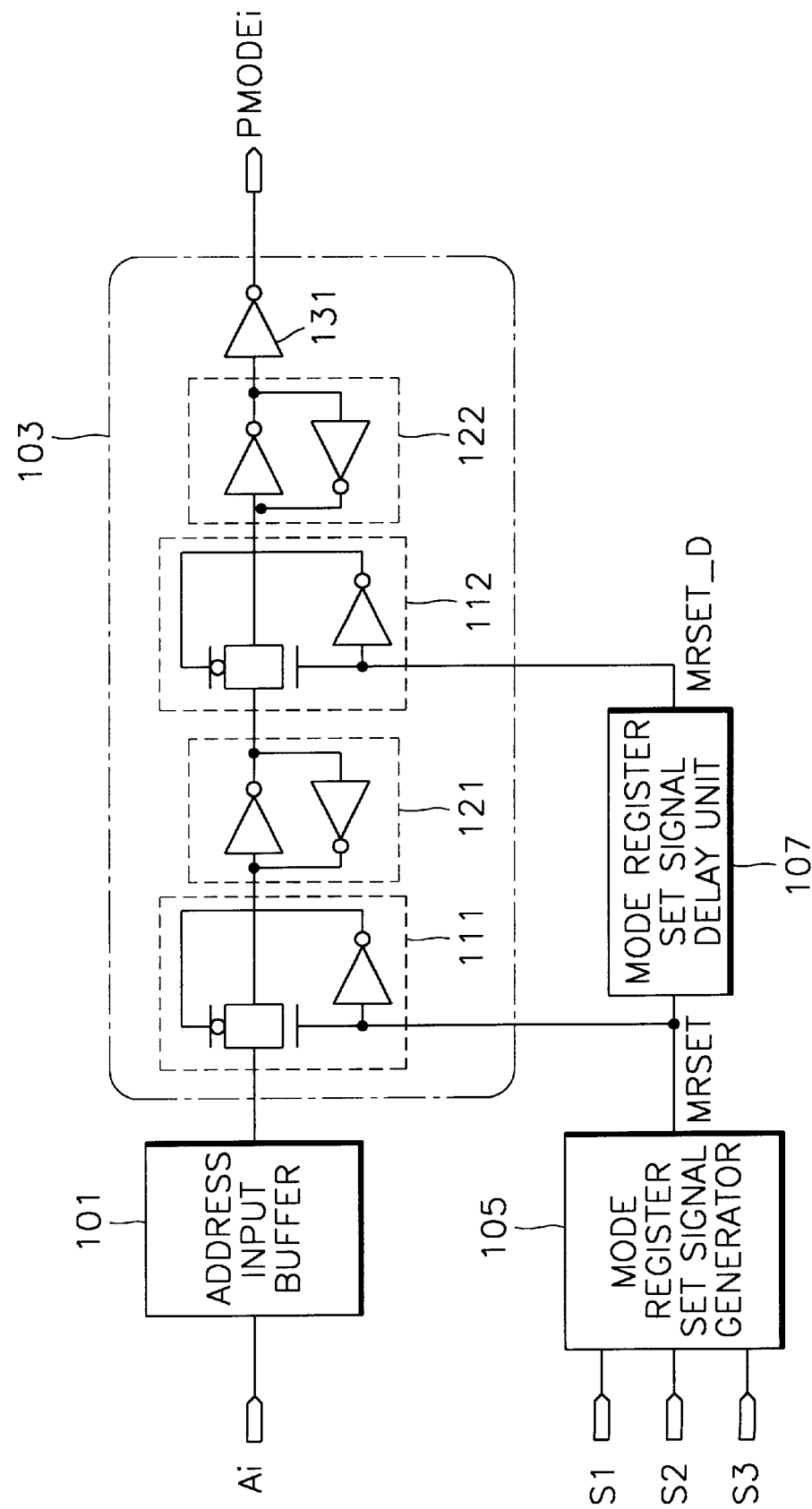
FIG. 1 is an electrical schematic of a conventional mode selection circuit for use in integrated circuit memory devices.
Figure 2:
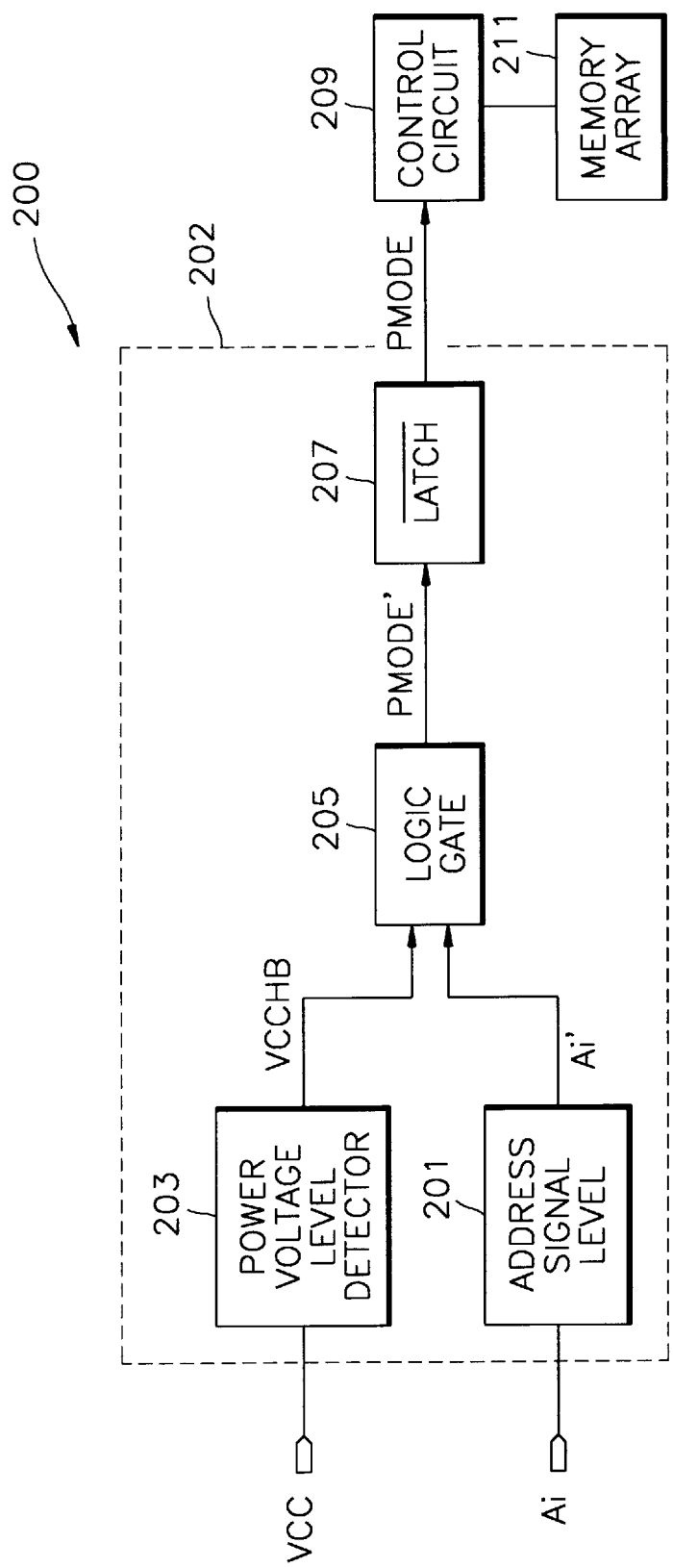
FIG. 2 a block diagram of a mode selection circuit according to an embodiment of the present invention.
Figure 3:
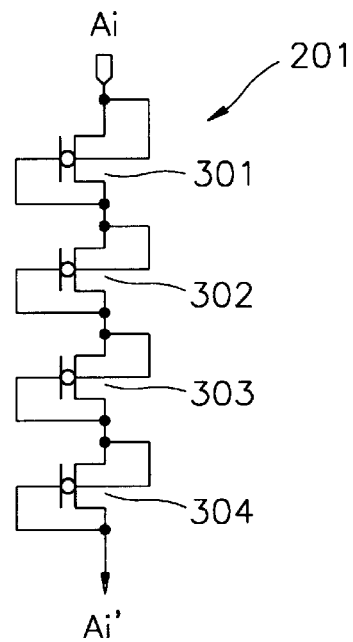
FIG. 3 is an electrical schematic of an address signal level shifter of FIG. 2.

Referring now to FIG. 2, a preferred integrated circuit memory device 200 according to an embodiment of the present invention includes a mode selection circuit 202 and an address signal level shifter 201 therein which generates signal Ai' as a downward level shifted version of the address signal Ai. As illustrated by FIG. 3, the level shifter 201 may comprise a plurality (e.g., 4) of PMOS transistors 301–304 which are electrically connected in series as diodes. As will be understood by those skilled in the art, if the magnitude of the threshold voltages of the PMOS transistors 301–304 is 0.7 volts, then a logic 1 address signal Ai having a magnitude of 8 volts will result in the generation of a logic 1 signal Ai' with a magnitude of 5.2 volts (8–4(0.7)=5.2). In contrast, a logic 1 address signal Ai having a magnitude of 3 volts will result in the generation of a logic 0 signal Ai' having a magnitude of 0.2 volts. Thus, the level shifter 201 can be used to detect signals which exceed a first threshold (e.g., 5 volts) since only signals having potentials which are greater than the threshold will be recognized as logic 1 signals at the output of the level shifter 201.

Figure 4:
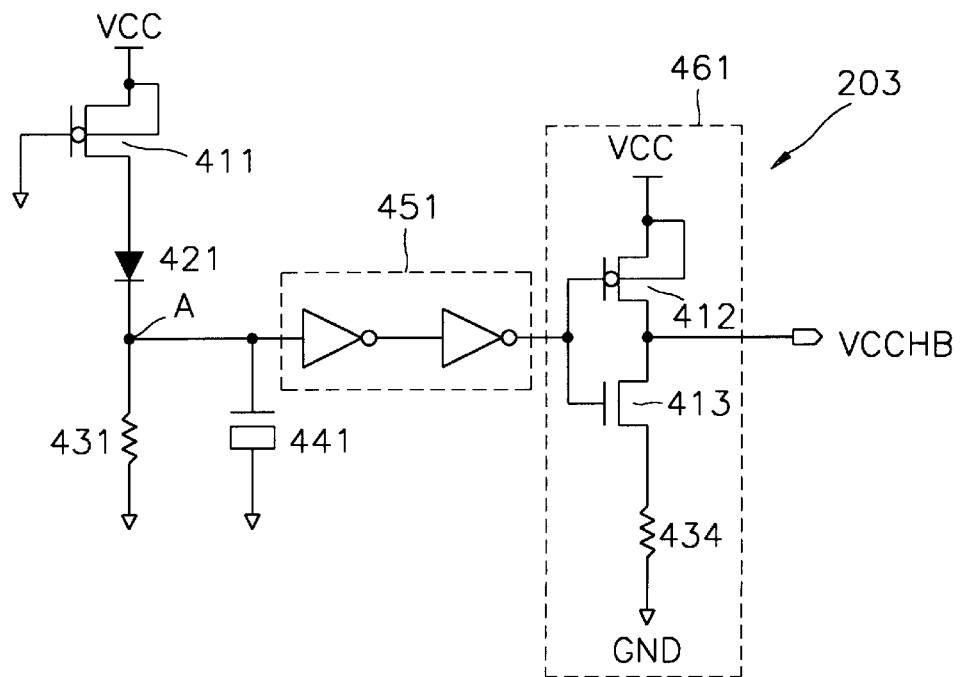
FIG. 4 is an electrical schematic of a power voltage detector of FIG. 2.

Referring again to FIG. 2, the preferred memory device 200 also includes a power voltage level detector 203 which generates signal VCCHB as a logic 1 signal when a power signal Vcc is below a second threshold and generates signal VCCHB as a logic 0 signal when the power supply signal Vcc is greater than the second threshold. As illustrated by FIG. 4, the power voltage level detector 203 may comprise PMOS transistors 411 and 412, NMOS transistor 413, diode 421, resistors 431 and 434, capacitor 441 and inverter chain 451, connected as illustrated. PMOS transistor 411, diode 421, resistor 431, capacitor 441 and inverter chain 551 constitute a level shifter. As will be understood by those skilled in the art, the PMOS transistor 411 and diode 421 provide a downward level shifted version of the power supply signal Vcc at node A. In particular, the voltage at node A (and across capacitor 441) is equal to Vcc–Vtp–Vbi, where Vtp is the magnitude of the threshold voltage of the PMOS transistor 411 and Vbi is the built-in voltage of the diode 421. Accordingly, because a logic 0 signal at node A will be passed through the inverter chain 451 as a logic 0 signal to an input of inverter 461 and because a logic 1 signal at node A will be passed through the inverter chain 451 as a logic 1 signal to the input of the inverter 461, a sufficiently large power supply signal Vcc will result in the generation of a logic 0 VCCHB signal.

However, upon power-up of the memory device 200 and at other times, a sufficiently small logic 1 power supply signal Vcc will result in a logic 1 VCCHB signal when the voltage $V_A$ at node A is recognized by the inverter chain 451 as a logic 0 signal. Stated alternatively, when the power supply signal Vcc is established at a "low" logic 1 potential, but the voltage $V_A$ at node A ($V_A$=Vcc–Vtp–Vbi) is recognized as a logic 0 potential, then VCCHB will be set to a low logic 1 potential when PMOS transistor 412 turns on. But, if the power supply signal Vcc is established at a sufficiently "high" logic 1 potential, and the voltage $V_A$ at node A is also recognized as a logic 1 potential, then VCCHB will be set to a logic 0 potential when NMOS transistor 413 turns on. Here, the resistor 434 provides some delay in the pull-down of signal line VCCHB when NMOS transistor 413 turns on.

Figure 5:
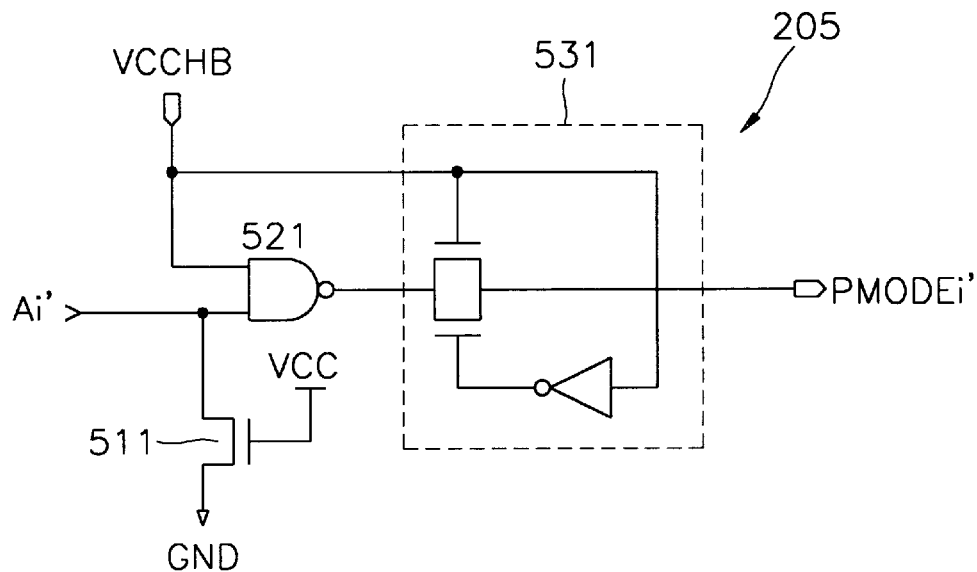
FIG. 5 is an electrical schematic of a logic gate of FIG. 2.

Referring now to FIGS. 2 and 5, a logic gate 205 is also provided to generate a preliminary mode selection signal PMODE'. As illustrated, the logic gate 205 comprises a normally-on NMOS transistor 511 which is relatively narrow (to provide a slight pull-down on signal line Ai'), a NAND gate 521 and a transmission gate 531. Based on this configuration of the logic gate 205, the application of a logic 1 signal Ai' will result in the generation of a logic 0 preliminary mode selection signal PMODE' if VCCHB is also set at a logic 1 potential (i.e., Vcc is at a "low" logic 1 potential) and the transmission gate 531 is turned on. An inverting latch 207 will also latch this logic 0 preliminary mode selection signal PMODE' as a logic 1 mode selection signal PMODE. This logic 1 mode selection signal PMODE is then passed to a control circuit 209 so that the memory device 200 and a memory array 211 therein can be operated in a first operating mode. However, as soon as the power supply signal Vcc is established at a "high" logic 1 level, VCCHB will transition to a logic 0 level and dispose the output of the transmission gate 531 in a high impedance state. In response, the latch 207 will maintain the mode selection signal PMODE at a logic 1 level so that the first operating mode can be sustained even if signal Ai' switches to a logic 0 level when the address signal Ai drops to a logic 1 level of 3 volts or less.

Figure 6:
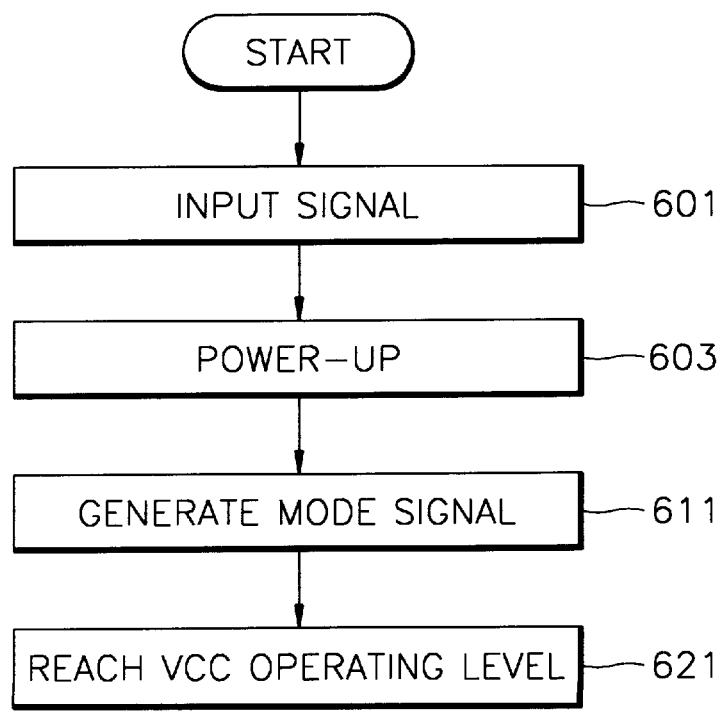
FIG. 6 a flow diagram of operations which illustrate methods of operating integrated circuit devices according to an embodiment of the present invention.

Referring now to FIG. 6, a preferred method of operating an integrated circuit memory device comprises the steps of generating an input signal (e.g., address signal Ai) at a level sufficiently high to cause signal Ai' to reach a logic 1 level, Block 601. This step is performed during a period when $V_A$ (=Vcc–Vtp–Vbi) is at a logic 0 potential and PMOS transistor 412 is turned on to establish VCCHB at a logic 1 level. Next, the power supply becomes fully powered, Block 603 and then the mode selection signal PMODE is generated so that the memory device can be disposed in an operating mode (e.g., test mode, refresh mode, etc.) designated by the mode selection signal, Block 611. After the mode selection signal PMODE has been generated, the power supply signal Vcc can be increased to a higher level, Block 621, to thereby lock-in the mode selection signal PMODE at a logic 1 level even if the input signal transitions to a logic 0 level. Accordingly, the present invention can utilize mode selection circuits containing level shifters to recognize when an existing signal line (or input signal pad) is being used as a mode selection signal line. The need for dedicated mode control signal lines can therefore be reduced.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. An integrated circuit device, comprising:
   a mode selection circuit which generates a signal that designates a first mode of the integrated circuit device when a potential of a first control signal is within a first range and a potential of a power supply signal is simultaneously within a second range and prevents changes in the potential of the first control signal from disabling the first mode when the potential of the power supply signal is not within the second range.

2. The device of claim 1, wherein the integrated circuit device is a memory device and wherein the first control signal is an address signal.

3. The device of claim 2, wherein said mode selection circuit comprises a level shifter which generates a downward level shifted version of the address signal.

4. The device of claim 1, wherein said mode selection circuit is responsive to an address signal and a power supply signal, generates a signal that designates a first mode of the integrated circuit device when a potential of the address signal exceeds a first threshold and a potential of the power supply signal is simultaneously below a second threshold and prevents changes in the potential of the address signal from disabling the first mode when a potential of the power supply signal exceeds the second threshold.

5. An integrated circuit memory device, comprising:
  a mode selection circuit which generates a signal that designates a mode of the memory device, said mode selection circuit having a first level shifter therein which is responsive to an address signal;
  a second level shifter having an input responsive to a power supply signal;
  an inverter having an input electrically coupled to an output of the second level shifter; and
  a logic gate which passes a true or complementary version of a level shifted address signal at an output of the first level shifter when an output of the inverter is at a first logic potential and blocks passage of the true or complementary version of the level shifted address signal when an output of the inverter is at a second logic potential opposite the first logic potential.

6. The device of claim 5, wherein the logic gate comprises:
  a NAND gate having a first input electrically connected to the output of the first level shifter and a second input electrically connected to the output of the inverter; and
  a transmission gate having a control input electrically connected to the output of the inverter and a data input electrically connected to an output of the NAND gate.

7. A method of operating an integrated circuit memory device, comprising the step of:
  disposing the memory device in a first operating mode in response to a level shifted first control signal, said disposing step comprising the steps of;
  generating a level shifted first control signal:
    generating a second control signal at a first logic potential upon detection that a potential of a power supply signal to the memory device is below a first threshold level and at a second logic potential upon detection that the potential of the power supply signal to the memory device is above the first threshold level; and
    generating an active mode selection signal if the level shifted first control signal exceeds a second threshold level while the second control signal is being generated at the first logic potential.

8. The method of claim 7, wherein the first control signal is an address signal.

9. A mode register set circuit of a semiconductor device, comprising:
  an address signal level shifter for receiving an input signal having mode information, and transmitting the input signal only when a voltage of the input signal is higher than during normal operation by a predetermined voltage;
  a power voltage level detector for outputting a power voltage detecting signal which is active when a power voltage is lower than a predetermined voltage;
  a logic gate for generating a mode signal in response to the power voltage detecting signal and the signal output from the address signal level detector; and
  a latch for latching the mode signal.

10. The mode register set circuit of claim 9, wherein the address signal level shifter includes a plurality of diodes for reducing the voltage of the input signal.

11. The mode register set circuit of claim 10, wherein the plurality of diodes are PMOS transistors.

12. The mode register set circuit of claim 9, wherein the power voltage level detector comprises:
  a buffer for buffering the power voltage; and
  an inverter for inverting the output of the buffer to generate the output of the power voltage level detector.

13. The mode register set circuit of claim 12, further comprising a resistor between the inverter and a ground, for delaying the output of the power voltage detector.

14. The mode register set circuit of claim 9, wherein the logic gate comprises:
  a negative logical product gate for receiving the power voltage detecting signal and the signal output from the address signal level shifter, transmitting the signal output from the address signal level shifter when the power voltage detecting signal is active, and blocking the signal output from the address signal level shifter when the power voltage detecting signal is inactive; and
  switching means for transmitting the output of the negative logical product gate when the power voltage detecting signal is active, and blocking the output of the negative logical product gate when the power voltage detecting signal is inactive.

15. The mode register set circuit of claim 14, further comprising another switching means for grounding an input of the negative logical product gate when the signal output from the address signal level shifter is low.

16. The mode register set circuit of claim 15, wherein the switching means comprises an transmission gate gated by the power voltage.

17. An integrated circuit device, comprising:
  means for generating a signal that designates a first mode of the integrated circuit device when a potential of a first control signal is within a first range and a potential of a power supply signal is simultaneously within a second range and preventing changes in the potential of the first control signal from disabling the first mode when the potential of the power supply signal is not within the second range.

18. The device of claim 17, wherein the integrated circuit device is a memory device and wherein the first control signal is an address signal.

19. The device of claim 18, wherein said means for generating a signal and preventing changes comprises a level shifter which generates a downward level shifted version of the address signal.

20. The device of claim 17, wherein said means for generating a signal and preventing changes is responsive to an address signal and a power supply signal, generates a signal that designates a first mode of the integrated circuit device when a potential of the address signal exceeds a first threshold and a potential of the power supply signal is simultaneously below a second threshold and prevents changes in the potential of the address signal from disabling the first mode when a potential of the power supply signal exceeds the second threshold.

* * * * *